US008357869B2

(12) United States Patent
Kreiter et al.

(10) Patent No.: US 8,357,869 B2
(45) Date of Patent: Jan. 22, 2013

(54) SWITCH ASSEMBLY WITH A CAPACITOR, AND CAPACITOR FOR A SWITCH ASSEMBLY

(75) Inventors: Csaba Kreiter, Stuttgart (DE); Jan Koegel, Mount Prospect, IL (US)

(73) Assignee: Robert Bosch GmbH, Stuttgart (DE)

( * ) Notice: Subject to any disclaimer, the term of this patent is extended or adjusted under 35 U.S.C. 154(b) by 284 days.

(21) Appl. No.: 12/761,006

(22) Filed: Apr. 15, 2010

(65) Prior Publication Data

US 2010/0264009 A1 Oct. 21, 2010

(30) Foreign Application Priority Data

Apr. 15, 2009 (DE) ........................ 10 2009 002 382

(51) Int. Cl.
*H03K 17/975* (2006.01)

(52) U.S. Cl. ........................................ 200/600

(58) Field of Classification Search .................. 200/600, 200/293, 303, 51.03; 439/620.09, 620.21; 361/752, 688, 797, 801, 811
See application file for complete search history.

(56) References Cited

U.S. PATENT DOCUMENTS

| | | | |
|---|---|---|---|
| 4,241,297 A | 12/1980 | Piber et al. | |
| 4,469,924 A * | 9/1984 | Badcock | 200/293.1 |
| 4,902,943 A * | 2/1990 | Nicholson et al. | 315/289 |
| 5,534,672 A | 7/1996 | Meagher | |
| 2001/0053066 A1* | 12/2001 | Malnati | 361/752 |

FOREIGN PATENT DOCUMENTS

| | | |
|---|---|---|
| EP | 0235735 A1 | 9/1987 |
| GB | 739226 A | 10/1955 |

* cited by examiner

*Primary Examiner* — Edwin A. Leon

(74) *Attorney, Agent, or Firm* — Maginot, Moore & Beck

(57) ABSTRACT

The invention relates to a switch assembly including a switch component, a switch housing, an electrical contact region, one or more user control elements, and a receiving region for a capacitor element. The capacitor element can be plugged by its contact elements into a receiving region of the switch housing. The invention also relates to a switch assembly with a plug-in capacitor element.

20 Claims, 7 Drawing Sheets

SWITCH ASSEMBLY WITH A CAPACITOR, AND CAPACITOR FOR A SWITCH ASSEMBLY

CROSS-REFERENCE TO RELATED APPLICATION

This application is based on German Patent Application 10 2009 002 382.8 filed Apr. 15, 2009.

BACKGROUND OF THE INVENTION

1. Field of the Invention

The invention is based on a switch assembly having a capacitor and on a capacitor for a switch assembly.

2. Description of the Prior Art

In electric power tools, the most various types of switch assemblies are in use. For instance, switch assemblies can be equipped with interference suppressing capacitors. Switch assemblies are also known in which discharge resistors are integrated with the interference suppression capacitor. For various tool requirements, many different switch assemblies are necessary.

ADVANTAGES AND SUMMARY OF THE INVENTION

In a first aspect of the invention, a switch component for a switch assembly, is provided, including a switch housing, an electrical contact region, a user control element, and a receiving region for a capacitor element, in which the capacitor element can be plugged by its contact elements into a receiving region of the switch housing.

Advantageously, the capacitor element can be disconnected from the switch component, and the capacitor element can be connected to the switch component by means of a plug connection. The plug connection can be accomplished for instance by means of mechanical connecting elements such as snap hooks, clamp connections, or the like. The capacitor can be connected to the switch housing with high positional accuracy. The security of the capacitor element against oscillation can be improved.

A design of the switch housing can be employed for a model series of tools or even an entire tool platform; for instance, only the capacitor element has to be adapted, depending on tool-specific or country-specific requirements, for instance in the event of radio interference requirements.

In an advantageous embodiment, the receiving region can be designed in pocketlike fashion for receiving the capacitor element. The capacitor element can be plugged in and retained with high positional accuracy, so that in operation as well, particularly in the event of vibration, the electrical and mechanical connection between the capacitor element and the switch housing can be ensured.

In an advantageous embodiment, the capacitor element can have second contacts, which in the plugged-in state of the capacitor element protrude outward from the switch housing for connecting one or more electrical components. Advantageously, such output lines of the capacitor element can be used for supplying power to components. Hence the input potential at the plug contacts of the capacitor element can experience a change of potential in the capacitor element, so that a different output potential is available at the output lines. In the case of a saber saw or some other type of electric power tool, by means of the different potentials, above all the capacitor element output potential, such components as lighting and/or a laser diode or other tool-specific performance characteristics can be supplied with the requisite electrical potential.

In an advantageous feature, the switch housing may have one or more detent elements for locking the capacitor element. The capacitor element can be retained securely and stably in the switch housing.

In an advantageous embodiment, the switch housing can have a cable comb, which when the capacitor element is plugged in can rest on an exterior of a housing of the capacitor element and can have one or more receptacles for parallel guidance of one or more cables. In particular, the cable comb can cooperate with a cable comb on the capacitor element. Advantageously, cables can be retained in a directionally oriented fashion. The cables can be simply clamped to the cable comb, which makes easy assembly possible. By means of one or more cable combs on the capacitor element, individual electromechanical demands can be taken into account in a simple way, for instance in that for different cable diameters to be constructed, different receiving openings in the cable comb can be provided.

In an advantageous embodiment, the receiving region can be disposed on the face end of the electrical contact region of the switch component. Hence cables can be extended conveniently past the capacitor element and connected to the electrical contact region.

In an advantageous embodiment, the electrical contact region can have electrical contact bushes for cables. In particular, cables in the plug contacts can be clampable or releasable by a slide mechanism. A slide mechanism of this kind is known for instance as a “quick release”, where by motion of the slide mechanism in one direction the contact bushes are released, so that cables can be plugged in, and upon a motion in the opposite direction, the cable can be clamped in the contact bushes.

In a further aspect of the invention, a switch assembly is proposed, including a switch component, a switch housing, an electrical contact region, a user control element, and a receiving region of the switch housing for a capacitor element, in which the capacitor element can be plugged by its contact elements into the receiving region of the switch housing.

Advantageously, the switch assembly can be used flexibly for various tools; in particular, depending on tool demands, different capacitors can be used for the same switch component, for instance in the case of different radio interference requirements, requirements that vary regionally, various types of tool, and the like. Advantageously, corresponding detent dimensions can be made uniform. In the development of a model series or an entire tool platform, structurally determined regions in the switch assembly or in the switch housing for a capacitor element can for instance be provided with the same dimensions and plug contact arrangements for connection to the switch housing. Thus switch assemblies can be economically produced by means of a markedly increased number of identical parts.

In a further aspect of the invention, a capacitor element for a switch assembly is proposed in which the capacitor element, on its capacitor housing, has detent elements that correspond with detent elements in a switch housing of the switch assembly.

Advantageously, the capacitor element can be designed electrically to suit tool-specific or country-specific requirements, for instance with or without a discharge resistor or with and without additional output lines for furnishing a power supply to components that can be connected to the capacitor element and that are plugged into a switch housing that is designed uniformly for instance for a model series or a tool platform.

In an advantageous embodiment, contact elements for connection to an electrical contact region of the switch component can be provided on a first face end. In particular on an opposed second face end, contact elements for connection of one or more electrical components can be provided. The capacitor element can be used for furnishing an additional voltage potential for power supply to components.

In an advantageous embodiment, an electrical resistor can be provided, which is disposed inside the capacitor housing. The electrical resistor, as a discharge resistor, can improve the function of the capacitor element.

In an advantageous embodiment, a cable comb can be disposed on the capacitor housing. Favorably, cables can be retained in the cable comb in a directionally oriented fashion, for instance by means of clamping. This makes it possible to simplify the installation of the cables and to accommodate the cables in a space-saving way.

BRIEF DESCRIPTION OF THE DRAWINGS

The invention will be better understood and further advantages thereof will become more apparent from the ensuing detailed description of preferred embodiments taken in conjunction with the drawings, in which.

DESCRIPTION OF THE PREFERRED EMBODIMENTS

Figure 1A:
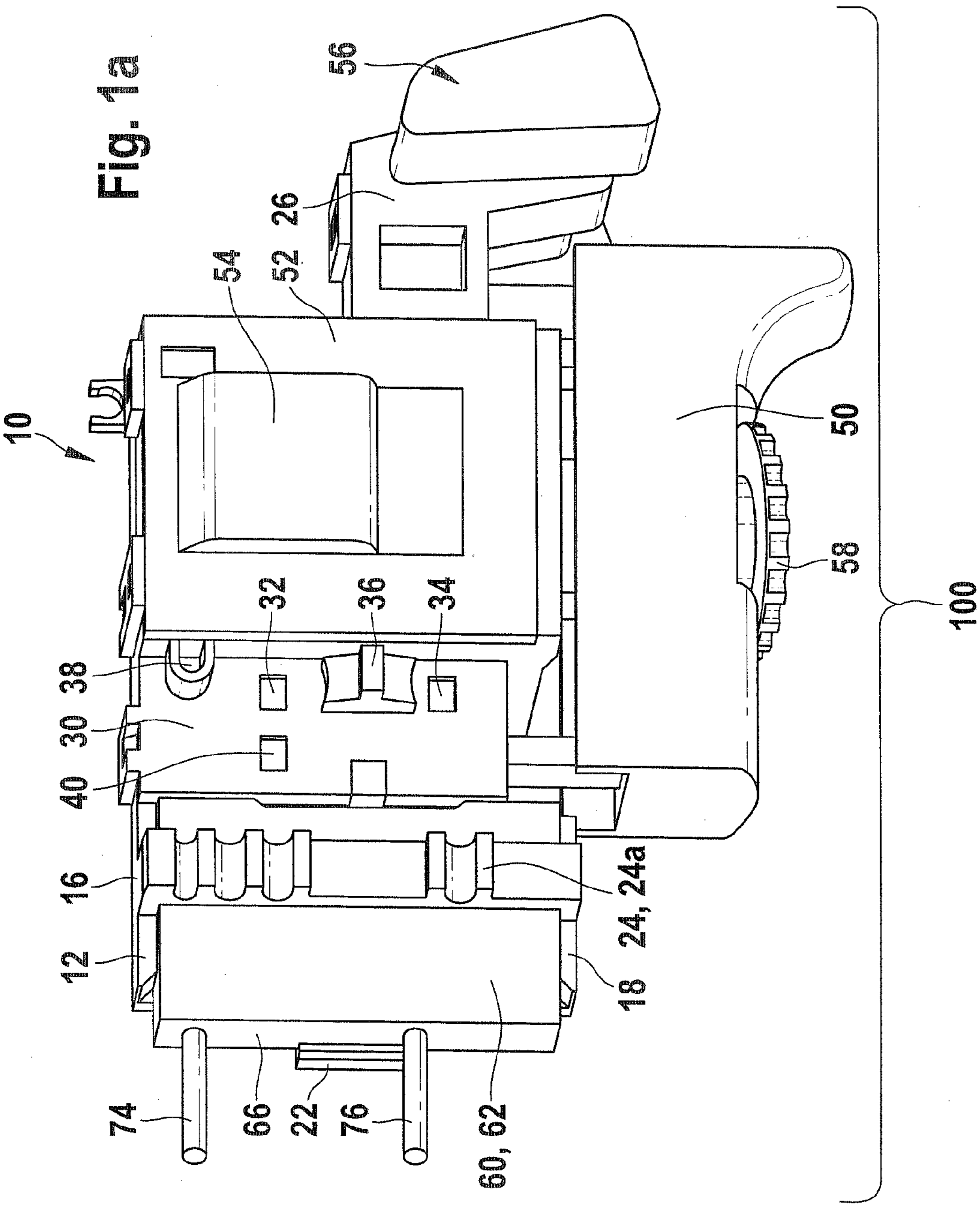
FIG. 1*a* shows as an example a switch assembly with a switch component including a switch housing and with a plugged-in capacitor element in accordance with the invention, without connected cables.

In the drawings, identical or similar components are identified by the same reference numerals.

Figure 1B:
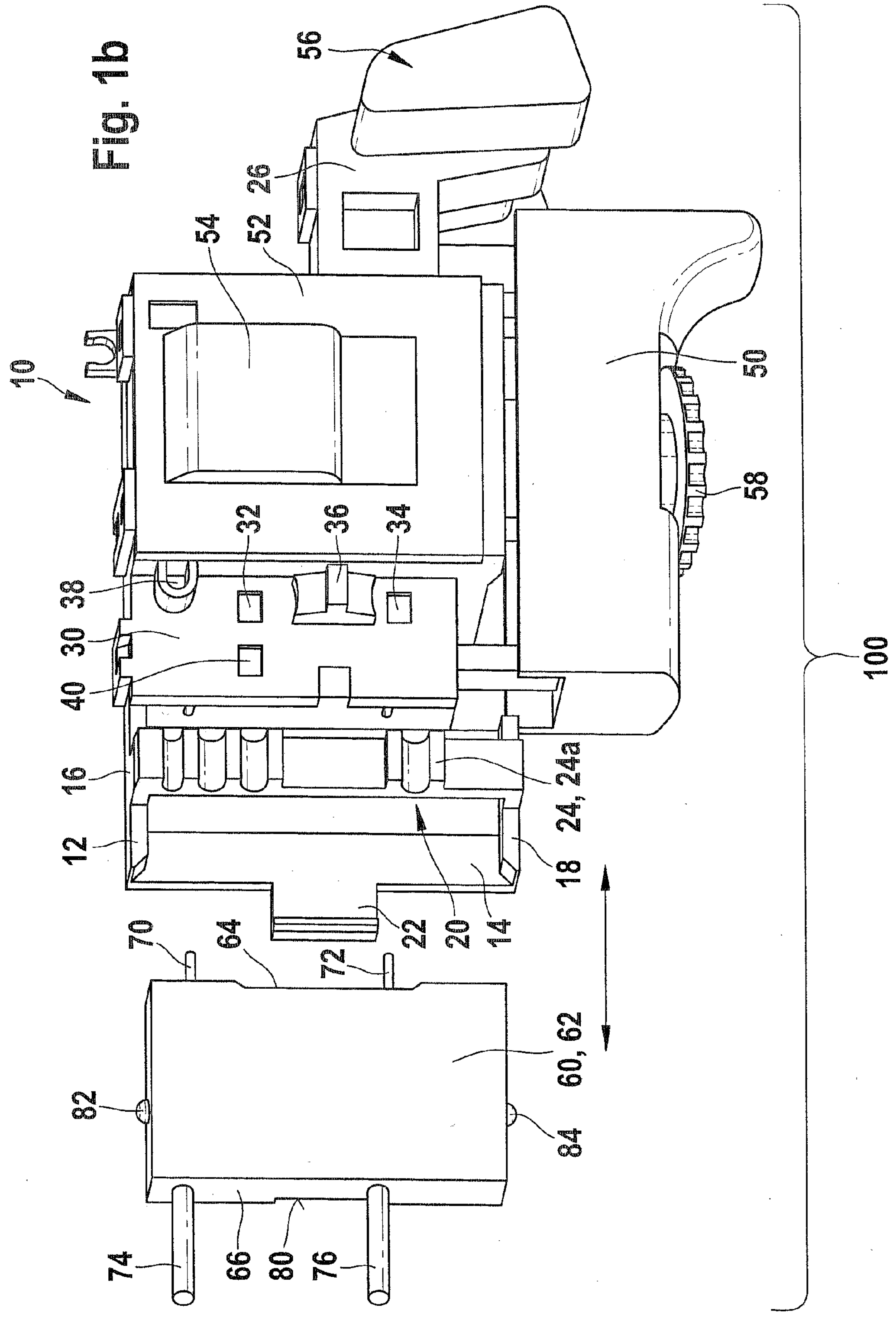
FIG. 1*b* shows the switch component of FIG. 1*a* with the capacitor element unplugged from the switch housing.

For explaining the invention, FIGS. 1*a* and 1*b* show one exemplary embodiment of a switch assembly 100 according to the invention, including a switch component 10, a switch housing, an electrical contact region 30, as an example a plurality of user control elements 50, 54, 56, and a receiving region 20 for a capacitor element 60. The capacitor element 60 can be plugged with its contact elements 70, 72 (FIG. 1*b*) into the receiving region 20 of the switch housing 12. FIG. 1*a* shows the capacitor element 60 in the plugged-in state; FIG. 1*a* shows the capacitor element 60 in the unplugged state, separately from the switch component 10.

The user control element 54, such as a slide switch or pushbutton, in the installed state of the switch assembly 100 in a tool, in particular in an electric power tool, can be actuated from outside by a user. The user control element 54 serves as the main switch, that is, the on/off switch of the electric power tool. The user control element 54 is disposed with a frame 52 on the rearward-extending electric contact element 26.

Below the user control element 54 or the electrical contact region 30 of an electric contact element 26 is the user control element 50, with which, when the main switch has be switched on, tool operation of the electric power tool is set in motion. The user control element 50 is embodied for instance as a latch switch and can be embodied in a single stage with a 0/1 signal position or in continuously variable fashion. When the user control element is actuated, for instance pushed upward, the power of the tool increases, for instance the number of strokes or speed of the sawblade in the case of a saber saw, with the advantage of direct control of the sawing speed during the sawing operation. On the underside of the user control element 50 is an adjusting element, embodied for instance as a rotary knob, not identified by reference numeral, which makes it possible to select a speed in advance.

The electric contact element 26 extends rearward to the rear user control element 56. In a first embodiment, the user control element 56 serves to lock the user control element 50. The user control element 56 serves to lock the user control element 50 in the pushed-in state and is preferably embodied as a purely mechanical locking means that is spring-supported in both directions of actuation. The user control element 50 is pressed until it comes to a stop and pushes the user control element 56 into the tool or back out again. With the user control element 56 still pressed, the user control element 50 is let go of and remains in a locked position. The user can work more conveniently, because he need not keep the user control element 50 constantly actuated.

The user control element 56, in a further feature, for instance in the case of manual circular saws, can be used as a switch-on block, to secure against unintentional switching on of the electric power tool. For instance, the user control element 50 can be actuated only when the user control element 56 is displaced to an end stop.

The receiving region 20 for receiving the capacitor element 60 is embodied in the switch housing 12 and designed in pocketlike fashion. The switch housing 12 has a partly open back side 14, an upper lateral guide 16, a lower lateral guide 18, and a front side 24*a* that is embodied as a cable comb 24. The capacitor element 60 can be thrust positionally precisely into the pocketlike receiving region 20 and retained. The capacitor element 60 conforms with a capacitor housing 62 closer to the back side 14, the lateral guides 16, 18, and the front side 24*a* of the pocketlike receiving region 20, so that the capacitor element 60 can be retained positionally accurately even in long-term use.

On the receiving region 20, the switch housing 12 has one or more detent elements, which lock the capacitor element 60 in the plugged-in state in the receiving region 20. For instance, one detent element 22 is provided in the form of a snap hook, which when the capacitor element 60 is plugged in snaps over the free face end 66 of the capacitor element.

In the embodiment shown, the capacitor element 60 has two contact elements 74, 76, which in the plugged-in state of the capacitor element 60 protrude outward from the switch housing 12. The optionally provided contact elements 74, 76 serve to connect one or more electrical components which for instance require a separate voltage potential from the capacitor element 60 or the switch assembly 100 itself.

The capacitor element 60 on its capacitor housing 62, has a detent face 80 that corresponds to the detent element 22 of the switch housing 12. On the side flanks of the capacitor element

60, detent lugs are also provided as detent elements 82, 84, which correspond with detent elements (not visible in the drawing) in the switch housing 12 of the switch assembly 100.

On the face end, the receiving region 20 abuts against the electrical contact region 30 of the switch housing 12, in which counterpart contacts, such as electrical outlets, for contact elements 70, 72, embodied as contact pins, of the capacitor element 60 are disposed. The contact elements 70, 72, embodied as contact pins, are disposed on the face end 64 of the capacitor element 60 opposite from the face end 66 and can be seen in FIG. 1*b* on the unplugged capacitor element 60.

The electrical contact region 30 has electrical contact bushes 32, 34, 38, 40 for cables; cables inserted into the contact bushes 32, 34 can be clamped or released by a slide mechanism 36. The cables can be inserted transversely to the length of the switch component 10 or the switch assembly 100.

Figure 2:
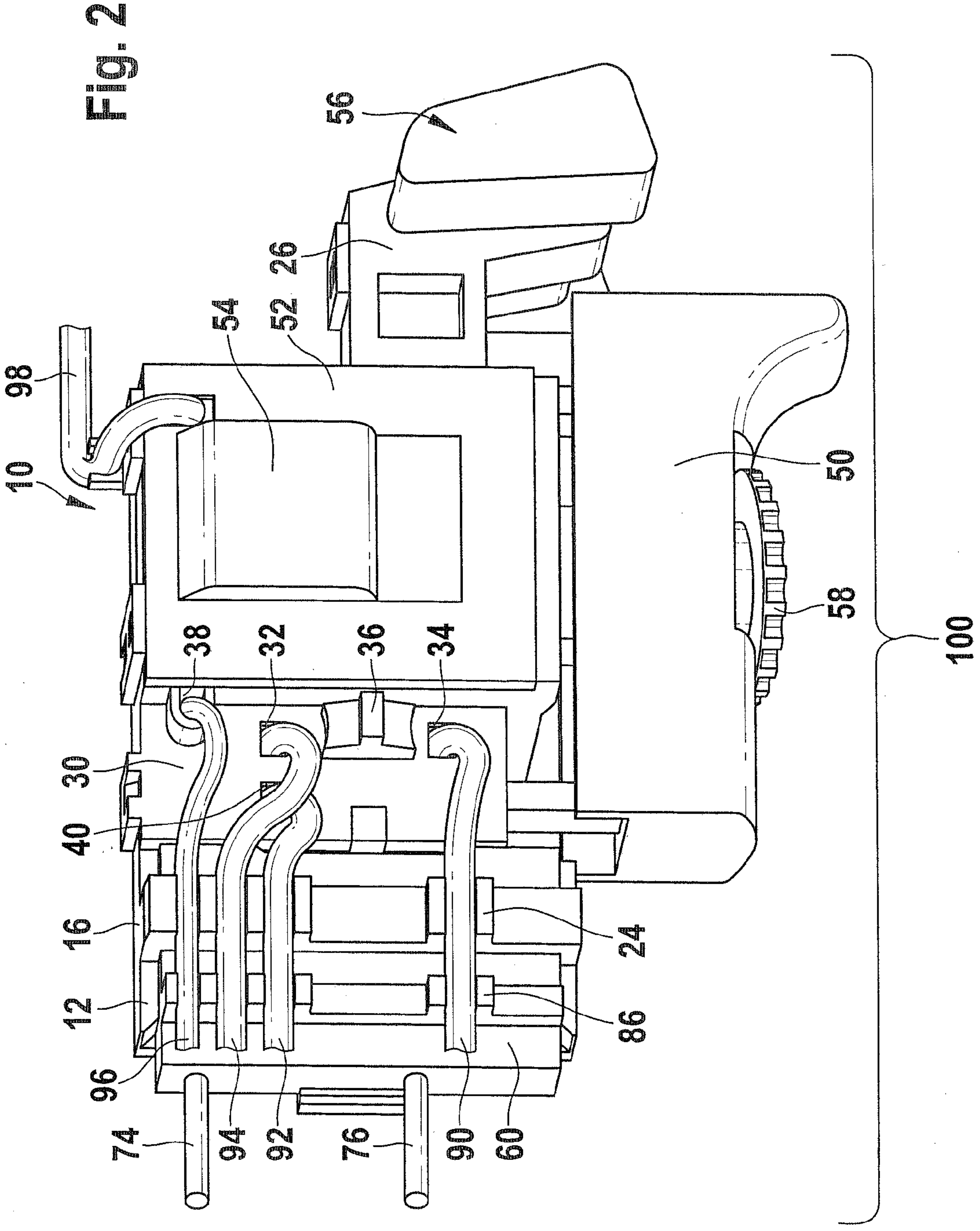
FIG. 2 as an example shows a switch assembly with an electrical contact region with connected cables, which are clamped in cable combs on a switch housing and on a capacitor element.

FIG. 2, as a detail, shows a switch assembly 100 in the embodiment described in conjunction with FIGS. 1*a* and 1*b*; in it, cables 90, 92, 94, 96 are inserted into the electrical contact bushes 32, 34, 38, 40 in the electrical contact region 30.

A further cable 98 is clamped in a suitable mount on the upper side face 16 of the switch housing.

In a distinction from the embodiment in FIGS. 1*a*, 1*b*, to which reference is made for detailed description of the components, not only does the switch housing 12 have a cable comb 24, but a corresponding cable comb 86 is also disposed on the housing of the capacitor element 60. In this way, connection cables can be affixed quickly and securely to the switch assembly 100.

Figure 3:
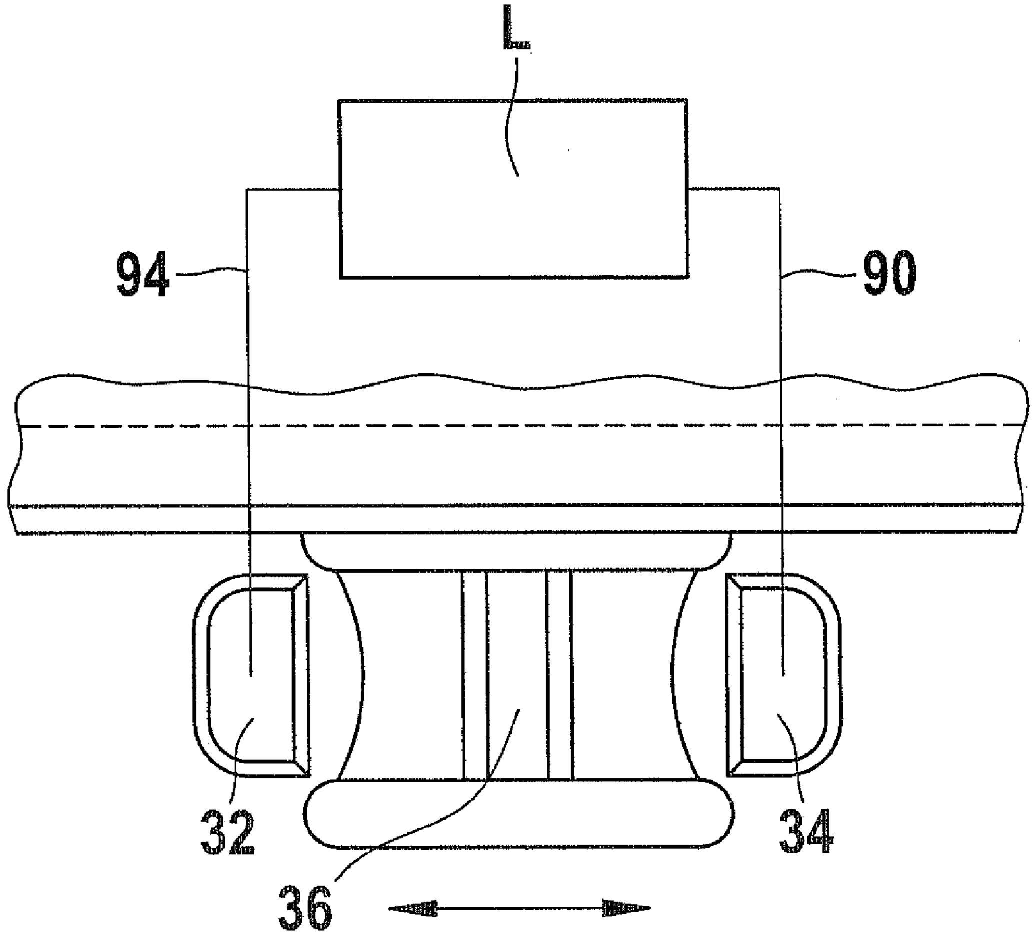
FIG. 3 shows a detail of a quick-release plug connection of cables in the electrical contact region of FIG. 2.

Two cables 90, 94, for instance connected to a load L, can be clamped in the contact bushes 32, 34 or released by the slide mechanism 36 ("quick release" mechanism) and can be inserted into the contact bushes 32, 34 in a single operation. This is shown in further detail in FIG. 3. After being inserted, the inserted cables 92, 94 can be clamped parallel to one another by the slide mechanism 36 in the contact bushes 32, 34 by means of a manual motion, without a tool. The course of motion for opening and closing the slide mechanism 36 is indicated by a double arrow.

Figure 4A:
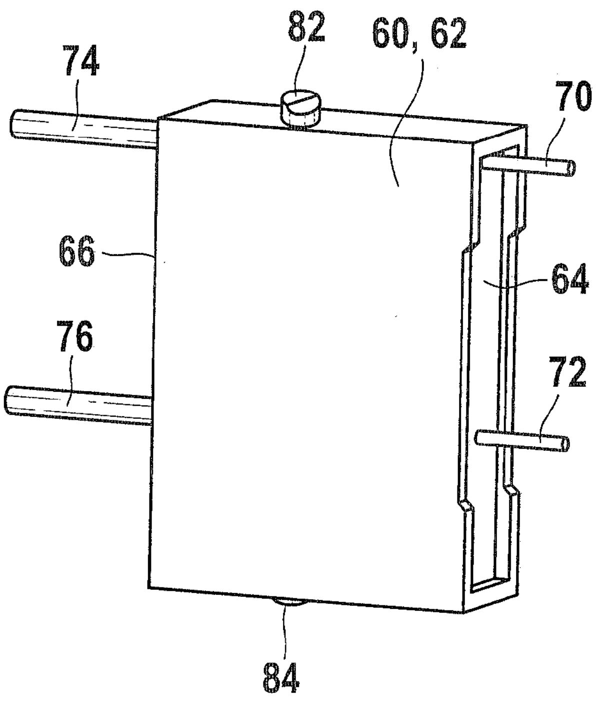
FIGS. 4*a* and 4*b* show an example of a capacitor element with output lines.
Figure 4B:
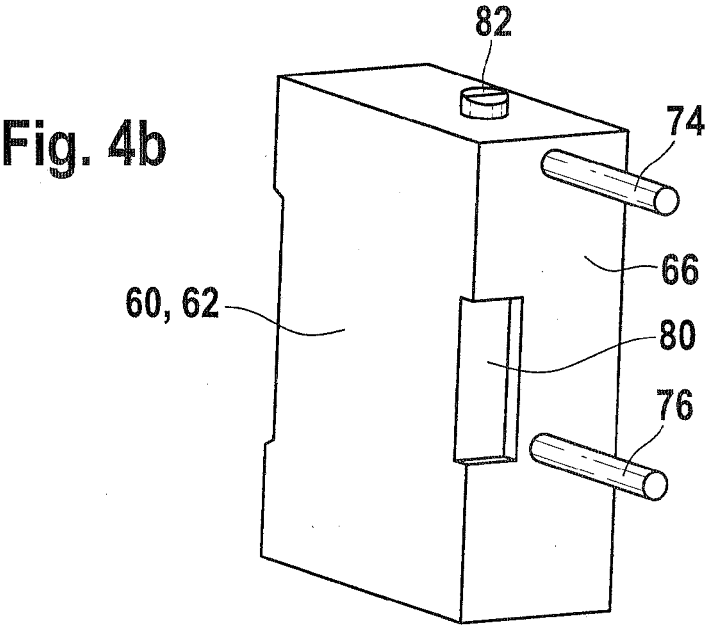

FIGS. 4*a* and 4*b* show an embodiment of a capacitor element 60 in accordance with the invention in various views.

On a first face end 64, contact elements 70, 72 for connection to an electrical contact region 30 of the switch assembly 100 (FIGS. 1*a*, 1*b*, 2) are provided. With these contacts, the capacitor element 60 is plugged into the electrical contact region 30 (FIGS. 1*a*, 1*b*, 2).

On an opposed second face end 66, contact elements 74, 76 for connecting one or more electrical components are provided. On the side faces of the capacitor housing 62, contact lugs 82, 84 are provided, which serve to latch or lock in corresponding detent elements of a switch housing 12 (FIGS. 1*a*, 1*b*, 2). A detent face 80 in the capacitor housing 62 that is disposed correspondingly to a detent element 22 (FIG. 1*b*), embodied for instance as a snap hook, of the switch housing 12 can be seen in FIG. 4*b*.

Figure 5:
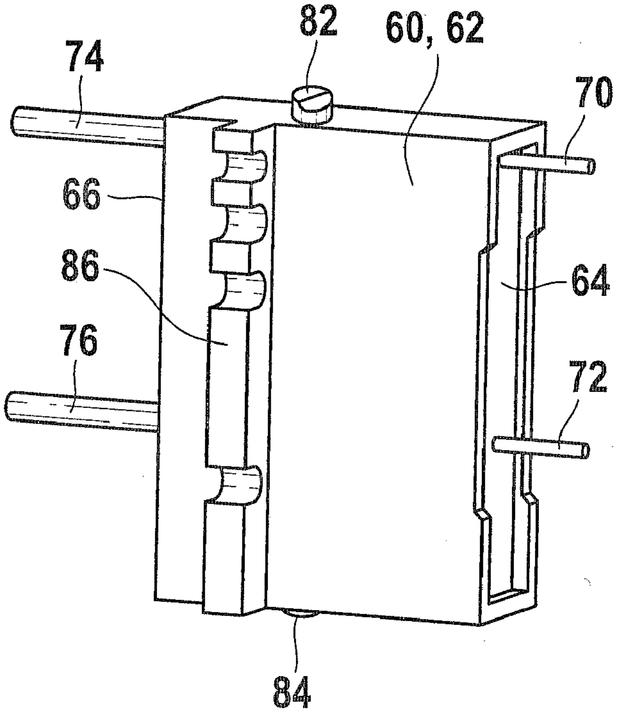
FIG. 5 shows an example of a capacitor element with a cable comb.

In this embodiment, the capacitor housing 62 does not have a cable comb. In FIG. 5, a variant of a capacitor element 60 is show in which a cable comb 86 is disposed on the capacitor housing 62. Otherwise, the embodiment corresponds to that of FIGS. 4*a*, 4*b*.

Figure 6:
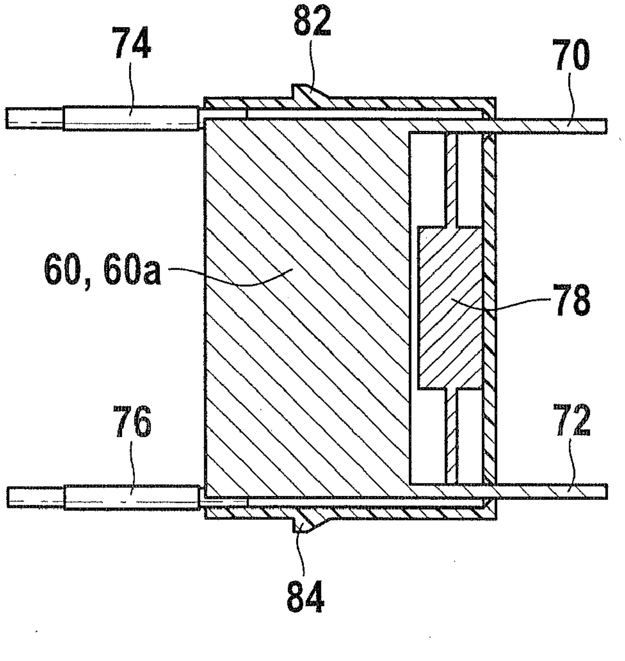
FIG. 6 shows a cross section through a capacitor element with an integrated discharge resistor.

FIG. 6 shows a longitudinal section through a capacitor element 60 in accordance with the embodiments in FIGS. 4*a*, 4*b* or FIG. 5. An electrical resistor 78 which is disposed inside the capacitor housing 62 (FIG. 5) is connected electrically in series with contact elements 70, 72 of the switch component. The resistor 78 is provided as a discharge resistor, which in the event of an electric short circuit protects the capacitor element 60 and electrical components connected to it. The electrical resistor 78 is potted, i.e. affixed with a potting compound, with the actual capacitor 60*a* in the capacitor housing 62.

Figure 7:
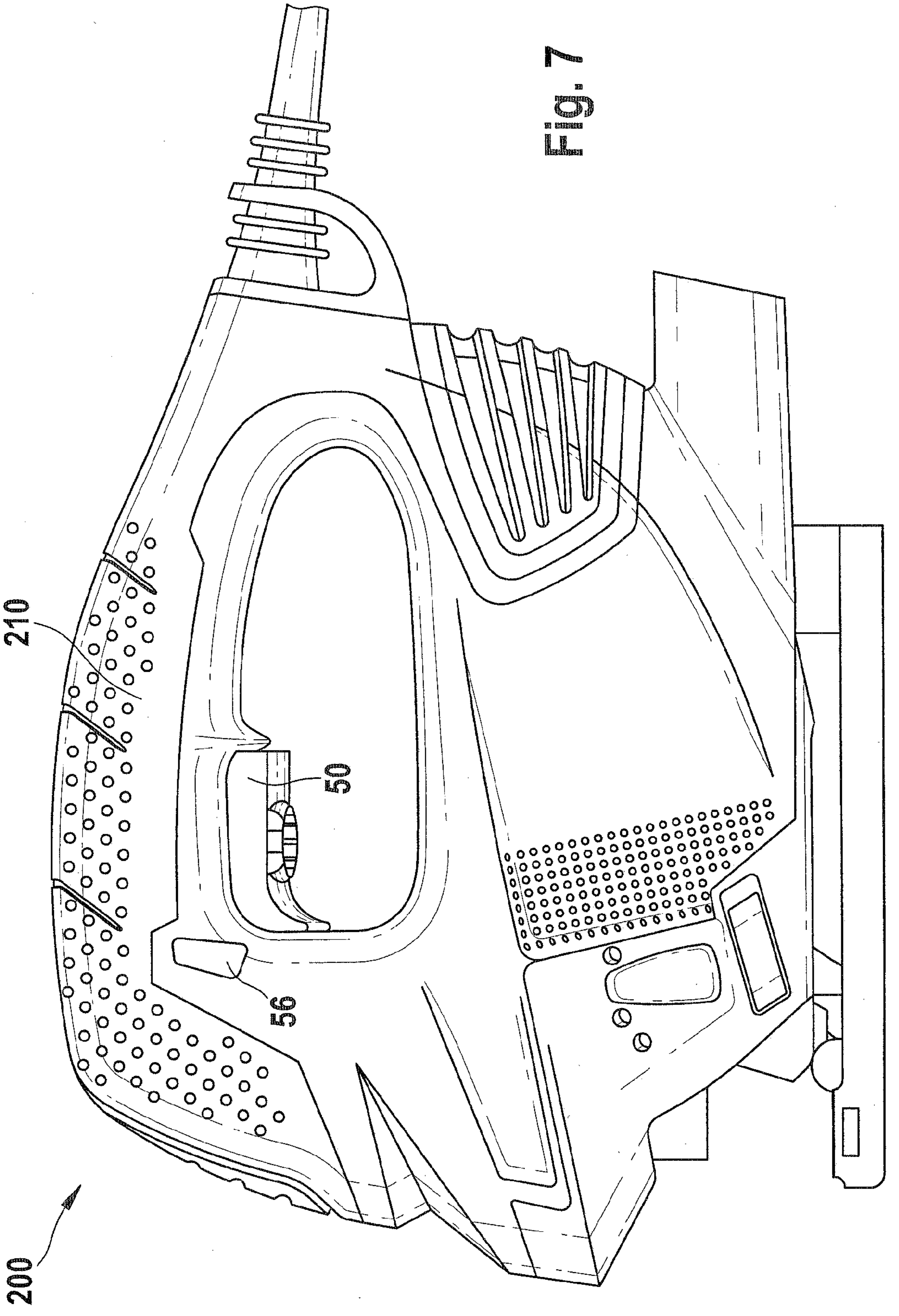
FIG. 7 shows an embodiment of an electric power tool with a switch assembly according to the invention.

FIG. 7 shows as an example an electric power tool 200 embodied as a saber saw, in which a switch assembly 100 (FIGS. 1*a*, 1*b*, 2) is built into a handle 210. The user control element 50 and the user control element 56 can be seen; they are disposed in an ergonomically clever way and allow convenient operation of the electric power tool 200.

The foregoing relates to preferred exemplary embodiments of the invention, it being understood that other variants and embodiments thereof are possible within the spirit and scope of the invention, the latter being defined by the appended claims.

We claimed:

1. A switch assembly, comprising:

a switch component having a switch housing, an electrical contact region, one or more user control elements, and a receiving region of the switch housing for a capacitor element; and a capacitor element having contact elements configured to be plugged into the receiving region of the switch housing, wherein the switch housing has a cable comb which, when the capacitor element is plugged in, rests on an exterior of a housing of the capacitor element and which has one or more receptacles configured to guide one or more cables.

2. The switch assembly as defined by claim 1, wherein the receiving region is designed in pocketlike fashion for receiving the capacitor element.

3. The switch assembly as defined by claim 1, wherein the capacitor element has one or more further contacts, which in a plugged-in state of the capacitor element protrude outward from the switch housing for connecting one or more electrical components.

4. The switch assembly as defined by claim 2, wherein the capacitor element has one or more further contacts, which in a plugged-in state of the capacitor element protrude outward from the switch housing for connecting one or more electrical components.

5. The switch assembly as defined by claim 1, wherein the switch housing has one or more detent elements for locking the capacitor element.

6. The switch assembly as defined by claim 2, wherein the switch housing has one or more detent elements for locking the capacitor element.

7. The switch assembly as defined by claim 4, wherein the switch housing has one or more detent elements for locking the capacitor element.

8. The switch assembly as defined by claim 1, wherein the cable comb cooperates with a cable comb on the capacitor element.

9. The switch assembly as defined by claim 7, wherein the cable comb cooperates with a cable comb on the capacitor element.

10. The switch assembly as defined by claim 1, wherein the receiving region is disposed on the face end of the electrical contact region of the switch component.

11. The switch assembly as defined by claim 1, wherein the electrical contact region has electrical contact bushes for cables.

12. The switch assembly as defined by claim 11, wherein the cables are configured to be clamped in or released from the contact bushes by use of a slide mechanism.

13. A switch component for a switch assembly, including a switch housing, an electrical contact region, one or more user control elements, and a receiving region of the switch housing for a capacitor element, wherein the capacitor element is configured to be plugged by its contact elements into the receiving region of the switch housing, and wherein the switch housing has a cable comb which, when the capacitor element is plugged in, rests on an exterior of a housing of the capacitor element and which has one or more receptacles configured to guide one or more cables.

14. A capacitor element for a switch assembly as defined by claim 13, wherein the capacitor element, on its capacitor housing, has detent elements which correspond with detent elements in the switch housing of the switch assembly, wherein on a first face end thereof, contact elements for connection to the electrical contact region of the switch assembly are provided, and wherein on an opposed second face end thereof, contact elements for connection of one or more electrical components are provided.

15. The capacitor element as defined by claim 14, wherein an electrical resistor is provided, which is disposed inside the capacitor housing.

16. The capacitor element as defined by claim 14, wherein a cable comb is disposed on the capacitor housing.

17. The switch assembly as defined by claim 1, wherein the one or more receptacles are configured to guide a plurality of cables in parallel alignment with respect to each other.

18. The switch component as defined by claim 13, wherein the one or more receptacles are configured to guide a plurality of cables in parallel alignment with respect to each other.

19. The switch assembly as defined by claim 1, wherein the one or more user control element is selected from the following group: a slide switch and a rotary knob.

20. The switch component as defined by claim 13, wherein the one or more user control element is selected from the following group: a slide switch and a rotary knob.

* * * * *